United States Patent
Moon et al.

(10) Patent No.: US 9,178,108 B2
(45) Date of Patent: Nov. 3, 2015

(54) LIGHT EMITTING DEVICE AND LIGHT EMITTING DEVICE PACKAGE

(75) Inventors: Yong Tae Moon, Seoul (KR); Jeong Sik Lee, Seoul (KR); Joong Seo Park, Seoul (KR); Ho Ki Kwon, Seoul (KR); Seoung Hwan Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 387 days.

(21) Appl. No.: 12/979,012

(22) Filed: Dec. 27, 2010

(65) Prior Publication Data

US 2011/0284821 A1    Nov. 24, 2011

Related U.S. Application Data

(60) Provisional application No. 61/347,812, filed on May 24, 2010, provisional application No. 61/347,816, filed on May 24, 2010.

(30) Foreign Application Priority Data

Jun. 23, 2010   (KR) .................. 10-2010-0059562

(51) Int. Cl.
*H01L 33/06* (2010.01)
*B82Y 20/00* (2011.01)
*H01L 33/38* (2010.01)
*H01L 33/12* (2010.01)

(52) U.S. Cl.
CPC .............. *H01L 33/06* (2013.01); *B82Y 20/00* (2013.01); *H01L 33/382* (2013.01); *H01L 33/12* (2013.01)

(58) Field of Classification Search
None
See application file for complete search history.

(56) References Cited

U.S. PATENT DOCUMENTS

| | | | | |
|---|---|---|---|---|
| 4,839,899 A | * | 6/1989 | Burnham et al. | 372/45.01 |
| 5,696,389 A | * | 12/1997 | Ishikawa et al. | 257/99 |
| 6,046,464 A | * | 4/2000 | Schetzina | 257/96 |
| 6,614,059 B1 | * | 9/2003 | Tsujimura et al. | 257/101 |
| 6,636,541 B1 | * | 10/2003 | Nakayama et al. | 372/45.01 |
| 2001/0022021 A1 | * | 9/2001 | Maekawa | 29/840 |
| 2002/0030200 A1 | * | 3/2002 | Yamaguchi et al. | 257/184 |
| 2002/0121645 A1 | * | 9/2002 | Yasukawa et al. | 257/99 |
| 2006/0244002 A1 | * | 11/2006 | Hooper et al. | 257/103 |
| 2006/0244003 A1 | * | 11/2006 | Ueda et al. | 257/103 |
| 2007/0085097 A1 | * | 4/2007 | Kim et al. | 257/94 |
| 2007/0151592 A1 | * | 7/2007 | Forrest et al. | 136/243 |
| 2007/0272936 A1 | * | 11/2007 | Shin | 257/97 |
| 2009/0045392 A1 | * | 2/2009 | Park et al. | 257/13 |
| 2009/0045393 A1 | * | 2/2009 | Nakahara | 257/13 |
| 2009/0146160 A1 | * | 6/2009 | Nakahara | 257/94 |
| 2009/0200645 A1 | * | 8/2009 | Kokawa et al. | 257/615 |
| 2010/0224852 A1 | * | 9/2010 | McLaurin | 257/13 |

* cited by examiner

*Primary Examiner* — Fei Fei Yeung Lopez
(74) *Attorney, Agent, or Firm* — KED & Associates LLP

(57) ABSTRACT

The embodiment relates to a light emitting device and a light emitting device package, wherein the light emitting device includes a first conduction type semiconductor layer, an active layer formed on the first conduction type semiconductor layer, and a second conduction type semiconductor layer formed on the active layer, wherein the active layer includes a quantum well layer and a quantum barrier layer, and a face direction lattice constant of the first conduction type semiconductor layer or the second conduction type semiconductor layer is greater than the face direction lattice constant of the quantum barrier layer and smaller than the face direction lattice constant of the quantum well layer.

11 Claims, 42 Drawing Sheets

33b

31b

33a

31a

10

31b

33

31a

10

33

31

10

LIGHT EMITTING DEVICE AND LIGHT EMITTING DEVICE PACKAGE

CROSS REFERENCE TO RELATED APPLICATION

This application claims the benefit of the Patent Provisional Application No. 61/347,812 and 61/347,816, filed on May 24, 2010, Korean Patent Application No. 10-2010-0059562 filed on Jun. 23, 2010 which is hereby incorporated by reference as if fully set forth herein.

BACKGROUND

1. Field

The embodiment relates to a light emitting device and a light emitting device package thereof.

2. Discussion of the Related Art

The light emitting device, such as a light emitting diode of a 3-5 group or 2-6 group compound semiconductor material or a laser diode, can produce different colors, such as red, blue, and ultra-violet owing to development of the thin film growth technology and materials therefore, as well as a white color of good efficiency by using a fluorescent material or mixing colors, and is advantageous in that the light emitting device has power consumption lower than the present light sources, such as a fluorescent light and an incandescent light, a fast response speed, and safe, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY

An object of the present embodiment is to provide a light emitting device and a light emitting device package, in which a compressive stress exerting in a quantum well layer in an active layer is moderated effectively for improving spontaneous light emission efficiency of the quantum well layer to provide a high efficiency light emitting device and a light emitting device package thereof.

To achieve these objects and other advantages, as embodied and broadly described herein, a light emitting device includes a first conduction type semiconductor layer, an active layer formed on the first conduction type semiconductor layer, and a second conduction type semiconductor layer formed on the active layer, wherein the active layer includes a quantum well layer and a quantum barrier layer, and a face direction lattice constant of the first conduction type semiconductor layer or the second conduction type semiconductor layer is greater than the face direction lattice constant of the quantum barrier layer and smaller than the face direction lattice constant of the quantum well layer.

In this instance, at least any one of the first conduction type semiconductor layer, the second conduction type semiconductor layer, the quantum well layer and the quantum barrier layer can include indium In, wherein an indium content of the first conduction type semiconductor layer or the second conduction type semiconductor layer can be greater than the indium content of the quantum barrier layer and smaller than the indium content of the quantum well layer.

The quantum well layer is formed of $In_xGa_{1-x}N$, the quantum barrier layer can be formed of $In_yGa_{1-y}N$, and the first conduction type semiconductor layer or the second conduction type semiconductor layer can be formed of $In_zGa_{1-z}N$, wherein composition x, y, z of the indium can be x>z>y.

The first conduction type semiconductor layer or the second conduction type semiconductor layer can include magnesium Mg, and at least any one of the quantum well layer and the quantum barrier layer can include indium In, wherein an indium content of the quantum barrier layer can be smaller than the indium content of the quantum well layer.

In this instance, the quantum well layer is formed of $In_xGa_{1-x}N$, the quantum barrier layer is formed of $In_yGa_{1-y}N$, and the first conduction type semiconductor layer or the second conduction type semiconductor layer is formed of $Mg_zZn_{1-z}N$, wherein the composition x, y of the indium can be x>y.

And, one of the first and second conduction type semiconductor layers, the quantum well layer, and the quantum barrier layer can have energy band gaps different from one another.

In this instance, the quantum barrier layer has an energy band gap greater than the energy band gap of the quantum well layer, and the first conduction type semiconductor layer or the second conduction type semiconductor layer has an energy band gap greater or smaller than the energy band gap of the quantum barrier layer.

And, the active layer can include a multi-quantum well structure of a repetitive stack of the quantum well layer and the quantum barrier layer, and, in this instance, the face direction lattice constant of at least one of the quantum barrier layer and the quantum well layer can become the greater as the at least one becomes the farther from any one of the first and second conduction type semiconductor layer.

And, the face direction lattice constant of at least one of the quantum barrier layer and the quantum well layer varies in a thickness direction with a gradient.

As another embodiment, a light emitting device includes a first conduction type semiconductor layer, an active layer formed on the first conduction type semiconductor layer, and a second conduction type semiconductor layer formed on the active layer, wherein the active layer includes a quantum well layer and a quantum barrier layer, and quantum barrier layer has a tensile stress with respect to the first conduction type semiconductor layer or the second conduction type semiconductor layer, the quantum well layer has a compressive stress with respect to the first conduction type semiconductor layer or the second conduction type semiconductor layer.

In this instance, the first conduction type semiconductor layer or the second conduction type semiconductor layer has a face direction lattice constant greater than the face direction lattice constant of the quantum barrier layer and smaller than the face direction lattice constant of the quantum well layer.

BRIEF DESCRIPTION OF THE DRAWINGS

Arrangements and embodiments may be described in detail with reference to the following drawings in which like reference numerals refer to like elements and wherein.

DETAILED DESCRIPTION

Reference will now be made in detail to the embodiments, examples of which are illustrated in the accompanying drawings.

Figure 1A:
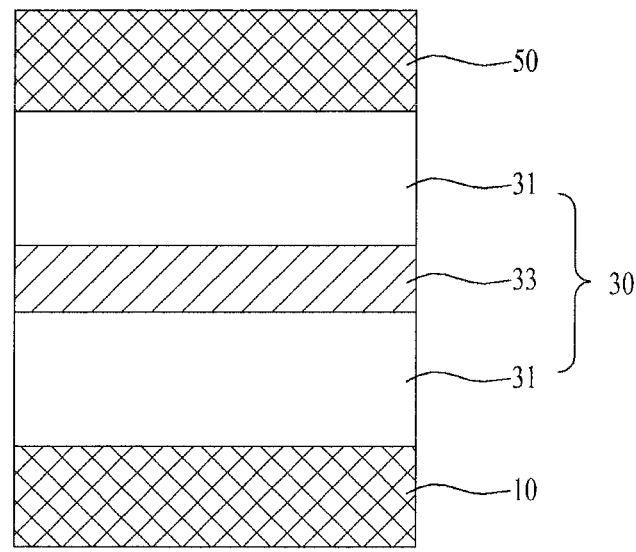
FIGS. 1A and 1B illustrate sections each showing a light emitting device in accordance with a preferred embodiment of the present invention.
Figure 1B:
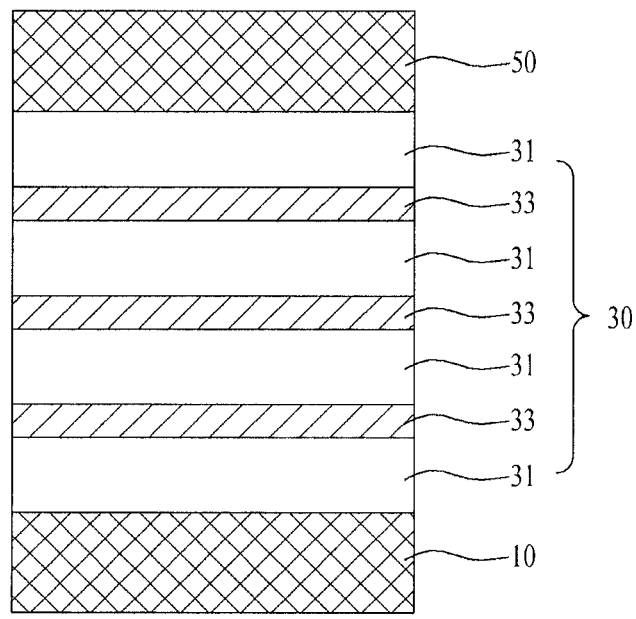

FIGS. 1A and 1B illustrate sections each showing a light emitting device in accordance with a preferred embodiment of the present invention, wherein FIG. 1A illustrates a section of a light emitting device having a active layer of single quantum well structure and FIG. 1B illustrates a section of a light emitting device having multi-quantum well structure.

Referring to FIGS. 1A and 1B, the light emitting device includes a first conduction type semiconductor layer 10, an active layer 30, and a second conduction type semiconductor layer 50, and the active layer 30 includes a quantum well layer 33 and a quantum barrier layer 31.

The active layer can have a single quantum well structure having a quantum well layer 33 as shown in FIG. 1A, or multi-quantum well having a plurality of quantum well layers 33 as shown in FIG. 1B.

The first conduction type semiconductor layer 10 can be an n type semiconductor layer as an electron injection layer, and the second conduction type semiconductor layer 50 can be a p type semiconductor layer as a hole injection layer, or, opposite to this, the first conduction type semiconductor layer 10 can be a p type semiconductor layer as a hole injection layer, and the second conduction type semiconductor layer 50 can be an n type semiconductor layer as an electron injection layer.

It is preferable that the quantum barrier layer 31 has a thickness of about 5~15 nm, the quantum well layer 33 has a thickness of about 2~3 nm, and the first conduction type semiconductor layer 10 or the second conduction type semiconductor layer 50 has a thickness of about 30 nm~200 um.

This is because injection and coupling of an electron and a hole becomes difficult making light emission efficiency poor, if the thicknesses of the quantum barrier layer 31 and the quantum well layer 33 are on an outside of above range.

It is preferable that the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, it is favorable that the face direction lattice constant of the quantum barrier layer 31 is smaller than the face direction lattice constant of the quantum well layer 33.

The face direction lattice constant of the quantum barrier layer 31 can be about 3.15~3.25 Å, the face direction lattice constant of the quantum well layer 33 can be about 3.35~3.55 Å, and the face direction lattice constant of the first or second conduction type semiconductor layer 10 or 50 can be about 3.2~3.5 Å.

A reason that the face direction lattice constant of the first conduction type semiconductor layer 10 or the second conduction type semiconductor layer 50 is formed different from the face direction lattice constant of the quantum barrier layer 31 or the quantum well layer 33 is as follows.

Figure 2:
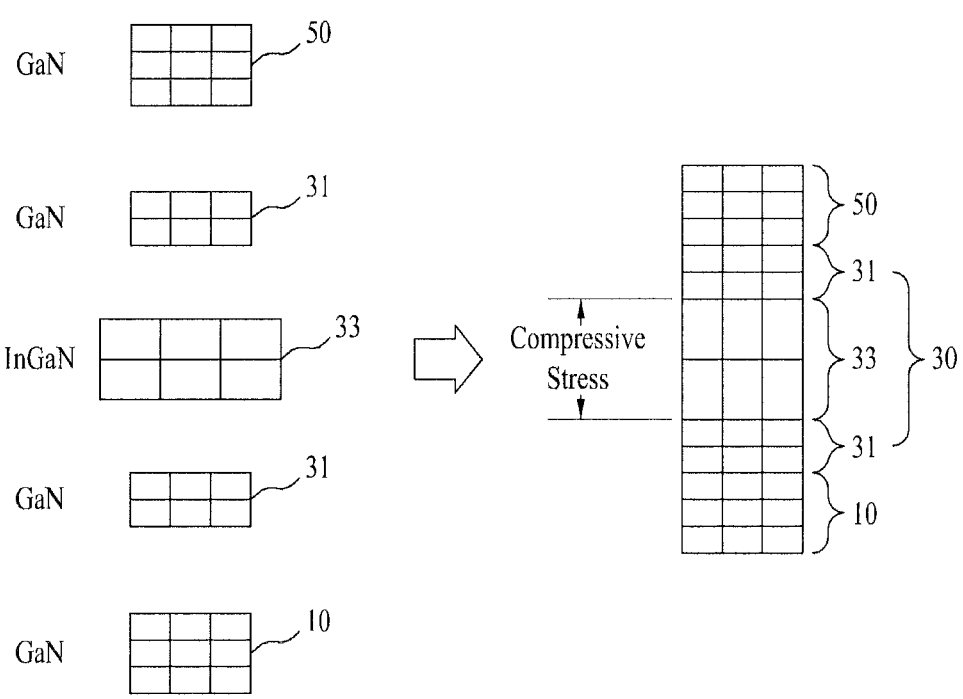
FIGS. 2 and 3 illustrate schematic views each showing a stress state of respective layers caused by a difference of lattice constants.
Figure 3:
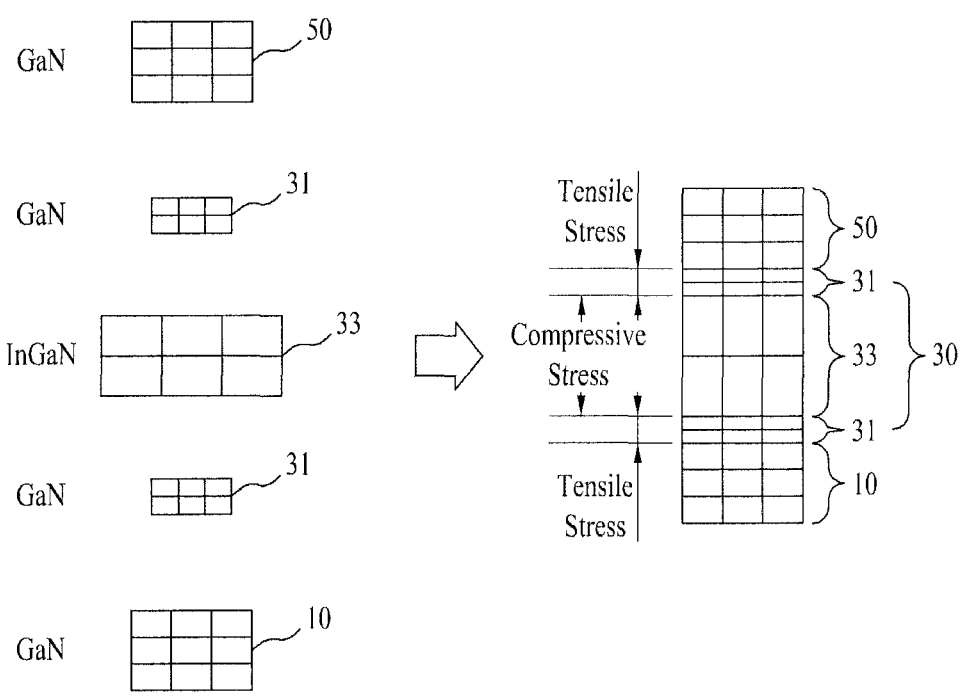

FIGS. 2 and 3 illustrate schematic views each showing a stress state of respective layers caused by a difference of lattice constants, wherein FIG. 2 illustrates a schematic view of a stress state in a case the face direction lattice constant of the first conduction type semiconductor layer 10 or the second conduction type semiconductor layer 50 is the same with the face direction lattice constant of the quantum barrier layer 31, and FIG. 3 illustrates a schematic view of a stress state in a case the face direction lattice constant of the first conduction type semiconductor layer 10 or the second conduction type semiconductor layer 50 is greater than the face direction lattice constant of the quantum barrier layer 31, and smaller than the face direction lattice constant of the quantum well layer 33.

Referring to FIG. 2, in the active layer having the quantum barrier layer 31 and the quantum well layer 33, if the face direction lattice constant of the quantum barrier layer 31 is smaller than the face direction lattice constant of the quantum well layer 33, the quantum well layer 33 has a stress exerting therein.

For an example, if GaN and InN which are nitride semiconductors are grown in film forms on a heterobulk substrate with the same crystallographic orientation, a difference of the face direction lattice constants of GaN and InN is about 10% which is substantial.

That is, the face direction lattice constant of the InN is about 10% greater than the face direction lattice constant of the GaN.

Accordingly, the face direction lattice constant of an InGaN quantum well layer having GaN and InN mixed at a certain ratio is greater than the face direction lattice constant of a GaN quantum barrier layer.

Therefore, in the active layer having an InGaN quantum well layer/a GaN quantum barrier layer formed on a first, second conduction type GaN semiconductor layer is subjected to an intensive compressive stress.

Thus, the intensive compressive stress exerting in the InGaN quantum well layer forms a large internal field, and deforms an energy band structure of the InGaN quantum well layer, to cause spatial separation of the electrons and holes in the InGaN quantum well layer, making a spontaneous emission rate poor, significantly.

Accordingly, referring to FIG. 3, in order to make effective moderation of the compressive stress in the InGaN quantum well layer, it is preferable that the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

As an embodiment for adjusting the face direction lattice constant, at least one of the first conduction type semiconductor layer 10, the second conduction type semiconductor layer 50, the quantum well layer 33 and the quantum barrier layer 31 includes indium In, wherein an indium content of the first conduction type semiconductor layer 10 or the second conduction type semiconductor layer 50 is greater than the indium content of the quantum barrier layer 31 and smaller than the indium content of the quantum well layer 33.

In this instance, the quantum well layer 33 is formed of $In_xGa_{1-x}N$, the quantum barrier layer 31 is formed of $In_yGa_{1-y}N$, and the first conduction type semiconductor layer 10 or the second conduction type semiconductor layer 50 is formed of $In_zGa_{1-z}N$, wherein it is preferable that composition x, y, z of the indium In is x>z>y.

Moreover, a range of the composition x, y, z of the indium In can be adjusted to be 0≤x, y, z≤0.3, wherein the range of the composition x of the indium In can be 0<x≤0.3, the range of the composition y of the indium In can be 0≤y≤0.1, and the range of the composition z of the indium In can be 0<z<0.3.

Figure 4:
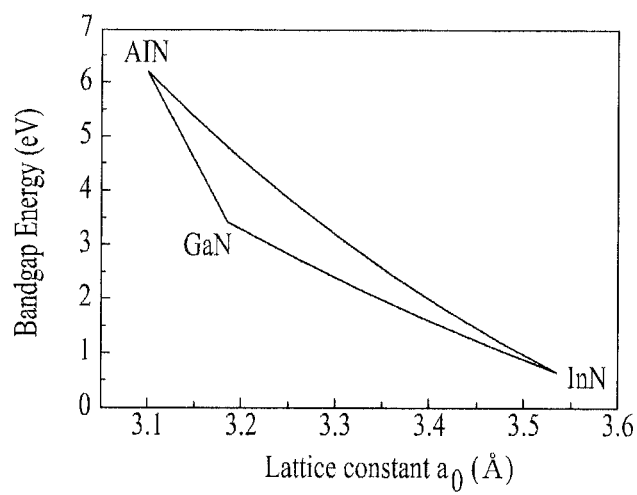
FIG. 4 illustrates a graph showing band gap energy vs. a face direction lattice constant of an InGaN semiconductor layer.

FIG. 4 illustrates a graph showing band gap energy vs. a face direction lattice constant of an InGaN semiconductor layer. As shown in FIG. 4, by adjusting the indium In content in the InGaN within a certain range, the face direction lattice constant thereof can be adjusted.

Accordingly, since the face direction lattice constant of the InGaN semiconductor layer is formed greater than the face direction lattice constant of the InGaN quantum barrier layer, the InGaN quantum barrier layer is subjected to a tensile stress, and since the face direction lattice constant of the InGaN quantum well layer is formed greater than the face direction lattice constant of the InGaN semiconductor layer, the InGaN quantum well layer is subjected to a compressive stress.

In this instance, the tensile stress exerting in the quantum barrier layer compensates and buffers the compressive stress exerting in the quantum well layer, partially.

Such moderation of the internal stress reduces the internal stress field exerting in the quantum well layer, to reduce the spatial separation of a wave function of the electrons and holes in the quantum well layer at the end, enhancing the spontaneous emission efficiency of the light emitting device.

As another embodiment, the first conduction type semiconductor layer 10 or the second conduction type semiconductor layer 50 includes magnesium Mg, at least any one of the quantum well layer 33 and the quantum barrier layer 31 includes indium In, wherein it is preferable that the indium content of the quantum barrier layer 31 is smaller than the indium content of the quantum well layer 33.

In this instance, the quantum well layer 33 is formed of $In_xGa_{1-x}N$, the quantum barrier layer 31 is formed of $In_yGa_{1-y}N$, and the first conduction type semiconductor layer 10 or the second conduction type semiconductor layer 50 is formed of $Mg_zZn_{1-z}N$, wherein it is preferable that composition x, y of the indium In is x>y.

Moreover, a range of the composition x of the indium In can be 0<x≤0.3, the range of the composition y of the indium In can be 0≤y≤0.1, and the range of the composition z of the magnesium Mg can be 0<z≤0.3.

Figure 5:
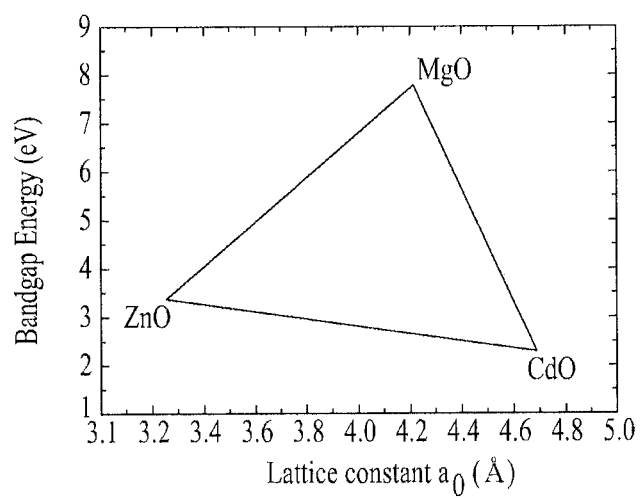
FIG. 5 illustrates a graph showing band gap energy vs. a face direction lattice constant of an MgZnO semiconductor layer.

FIG. 5 illustrates a graph showing band gap energy vs. a face direction lattice constant of an MgZnO semiconductor layer. As shown in FIG. 5, by adjusting a magnesium Mg content in the MgZnO within a certain range, the face direction lattice constant thereof can be adjusted.

Accordingly, since the face direction lattice constant of the MgZnO semiconductor layer is formed greater than the face direction lattice constant of the InGaN quantum barrier layer, the InGaN quantum barrier layer is subjected to a tensile stress, and since the face direction lattice constant of the InGaN quantum well layer is formed greater than the face direction lattice constant of the InGaN semiconductor layer, the InGaN quantum well layer is subjected to a compressive stress.

In this instance, the tensile stress exerting in the quantum barrier layer compensates and buffers the compressive stress exerting in the quantum well layer partially.

Such moderation of the internal stress reduces the internal stress field exerting in the quantum well layer, to reduce the spatial separation of a wave function of the electrons and holes in the quantum well layer at the end, enhancing the spontaneous emission efficiency of the light emitting device.

As another embodiment, the present invention can be configured such that, at least any one of the first conduction type semiconductor layer, the second conduction type semiconductor layer, the quantum well layer and the quantum barrier layer includes indium In, and the first conduction type semiconductor layer or the second conduction type semiconductor layer includes aluminum Al.

In this instance, the indium content of the first conduction type semiconductor layer or the second conduction type semiconductor layer can be greater than the indium content of the quantum barrier layer and smaller than the indium content of the quantum well layer.

Depending on cases, the indium content of the first conduction type semiconductor layer or the second conduction type semiconductor layer can be smaller than the indium content of the quantum barrier layer and the indium content of the quantum well layer.

For an example, the quantum well layer can be formed of $In_xGa_{1-x}N$, the quantum barrier layer can be formed of $In_yGa_{1-y}N$, and the first conduction type semiconductor layer or the second conduction type semiconductor layer can be formed of $In_zAl_xGa_{1-z}N$, wherein composition x, y, z of the indium is x>z>y.

Figure 6A:
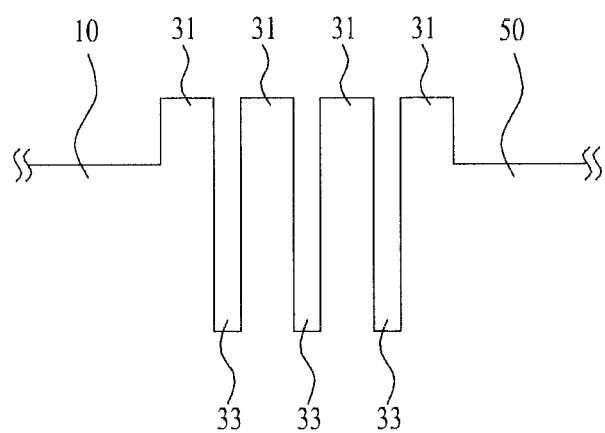
FIGS. 6A and 6B illustrate energy band diagrams of the light emitting device in FIG. 1B, respectively.
Figure 6B:
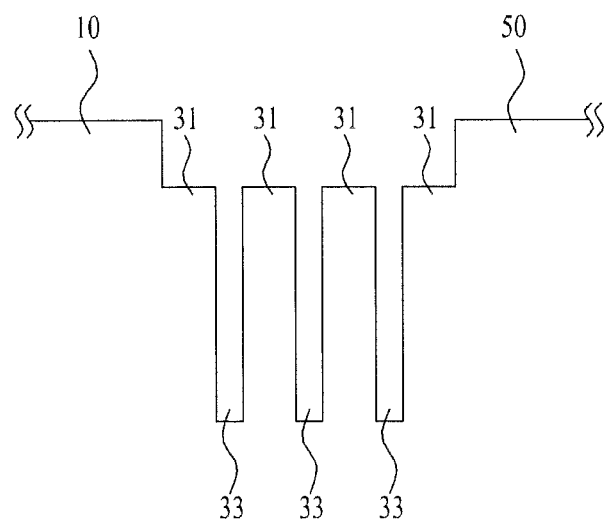

FIGS. 6A and 6B illustrate energy band diagrams of the light emitting device in FIG. 1B, respectively. As shown in FIGS. 6A and 6B, it can be known that any one of the first, and the second conduction type semiconductor layers 10 and 50, the quantum well layer 33 and the quantum barrier layer 31 have energy band gaps different from one another.

That is, the quantum barrier layer 31 can have an energy band gap greater than the energy band gap of the quantum well layer 33, and the first conduction type semiconductor layer 10 or the second conduction type semiconductor layer 50 can have an energy band gap greater or smaller than the energy band gap of the quantum barrier layer 31.

In this instance, the energy band gap of the quantum barrier layer 31 can be about 2.5~3.5 eV, the energy band gap of the quantum well layer 33 can be about 0.5~2.0 eV, and the energy band gap of the first conduction type semiconductor layer 10 or the second conduction type semiconductor layer 50 can be about 1.0~8.0 eV.

Figure 7:
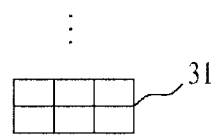
FIGS. 7 to 9 illustrate schematic views of lattice constant differences of respective layers of light emitting devices in accordance with another preferred embodiment of the present invention, respectively.
Figure 7:
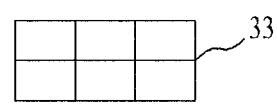
Figure 7:
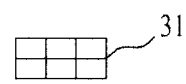
Figure 7:
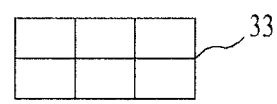
Figure 7:
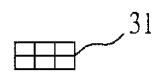
Figure 7:
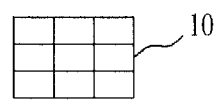
Figure 8:
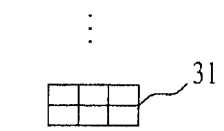
Figure 8:
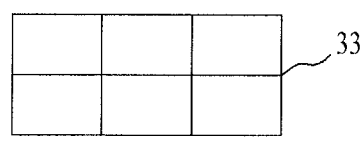
Figure 8:
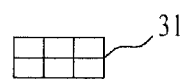
Figure 8:
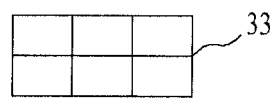
Figure 8:
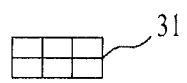
Figure 8:
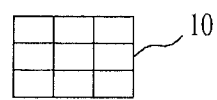
Figure 9:
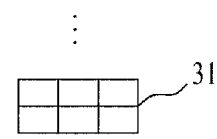
Figure 9:
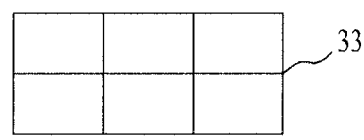
Figure 9:
Figure 9:
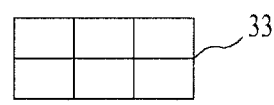
Figure 9:
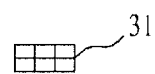
Figure 9:
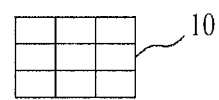

FIGS. 7 to 9 illustrate schematic views of lattice constant differences of respective layers of light emitting devices in accordance with another preferred embodiment of the present invention, respectively.

Referring to FIGS. 7 to 9, the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the face direction lattice constant of at least any one of the quantum barrier layer 31 and the quantum well layer 33 can become the greater gradually as the quantum barrier layer 31 and the quantum well layer 33 become the farther from any one of the first, and second conduction type semiconductor layers 10 and 50.

In this instance, FIG. 7 illustrates a schematic view showing that the face direction lattice constant of the quantum barrier layer 31 becomes the greater gradually as the quantum barrier layer 31 becomes the farther from any one of the first, and second conduction type semiconductor layers 10 and 50, wherein though all of the quantum well layers 33 have the same indium contents, the quantum barrier layer 31 has an indium content which becomes the greater gradually as the quantum barrier layer 31 becomes the farther from any one of the first and second conduction type semiconductor layers 10 and 50.

That is, the indium content of the quantum barrier layer 31 far from the first and second conduction type semiconductor layers 10 and 50 is greater than the indium content of the quantum barrier layer 31 adjacent to the first, second conduction type semiconductor layer 10, 50, and the quantum barrier layers 31 adjacent to each other can have the indium contents different from each other.

FIG. 8 illustrates a schematic view showing that the face direction lattice constant of the quantum well layer 33 becomes the greater gradually as the quantum well layer 33 becomes the farther from any one of the first, and second conduction type semiconductor layers 10 and 50, wherein though all of the quantum barrier layers 31 have the same indium contents, the quantum well layer 33 has an indium content which becomes the greater gradually as the quantum well layer 33 becomes the farther from any one of the first and second conduction type semiconductor layers 10 and 50.

That is, the indium content of the quantum well layer 33 far from the first, second conduction type semiconductor layer 10, 50 is greater than the indium content of the quantum well layer 33 adjacent to the first, second conduction type semiconductor layer 10, 50, and the quantum well layers 33 adjacent to each other can have the indium contents different from each other.

FIG. 9 illustrates a schematic view showing that the face direction lattice constants of the quantum barrier layer 31 and the quantum well layer 33 become the greater gradually as the quantum barrier layer 31 and the quantum well layer 33 become the farther from any one of the first, and second conduction type semiconductor layers 10 and 50, wherein it can be known that the quantum well layer 33 and the quantum barrier layer 31 have the indium contents which become the greater gradually as the quantum well layer 33 and the quantum barrier layer 31 become the farther from any one of the first and second conduction type semiconductor layers 10 and 50.

That is, the indium contents of the quantum well layer 33 and the quantum barrier layer 31 far from the first, second conduction type semiconductor layer 10, 50 are greater than the indium contents of the quantum well layer 33 and the quantum barrier layer 31 adjacent to the first, second conduction type semiconductor layer 10, 50, and the quantum well layers 33 or the quantum barrier layers 31 adjacent to each other can have the indium contents different from each other.

Though not shown, depending on cases, only at least any one of the quantum well layers 33 can have a different lattice constant, excluding a first quantum well layer 33 adjacent to the first, second conduction type semiconductor layer 10, 50.

Or, only at least any one of the quantum barrier layers 31 can have a different lattice constant, excluding a first quantum barrier layer 31 adjacent to the first, second conduction type semiconductor layer 10, 50.

FIGS. 10 to 14 illustrate energy band diagrams according to FIGS. 7 to 9, respectively.

Figure 10:
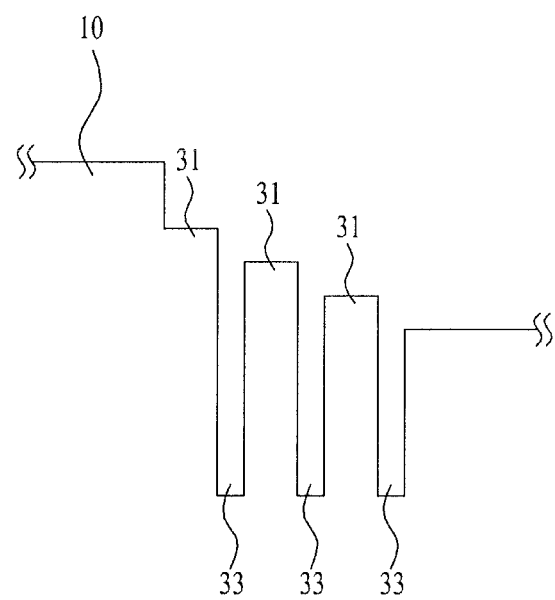
FIGS. 10 to 14 illustrate energy band diagrams according to FIGS. 7 to 9, respectively.

FIG. 10 illustrates an energy band diagram according to the lattice constant difference in FIG. 7, wherein, as shown in FIG. 10, it can be known that the energy band gap of the quantum barrier layer 31 becomes the smaller gradually as the quantum barrier layer 31 becomes the farther from any one of the first and second conduction type semiconductor layers 10 and 50.

Figure 11:
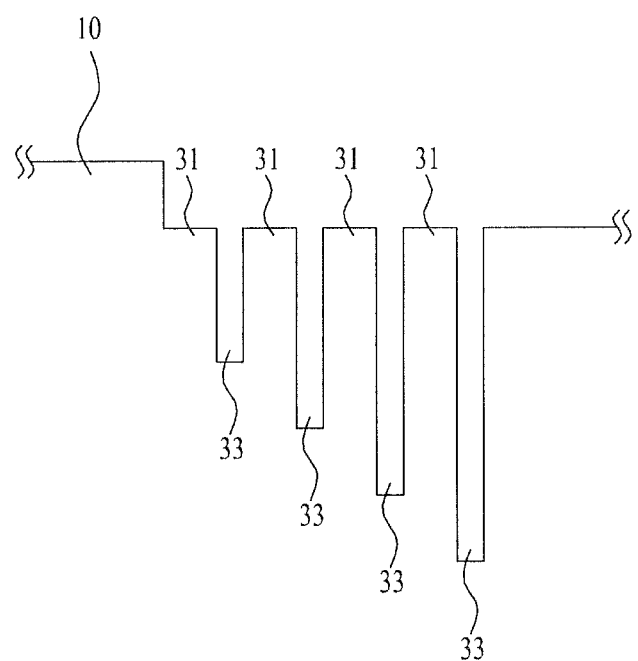

FIG. 11 illustrates an energy band diagram according to the lattice constant difference in FIG. 8, wherein, as shown in FIG. 11, it can be known that the energy band gap of the quantum well layer 33 becomes the smaller gradually as the quantum well layer 33 becomes the farther from any one of the first and second conduction type semiconductor layers 10 and 50.

Figure 12:
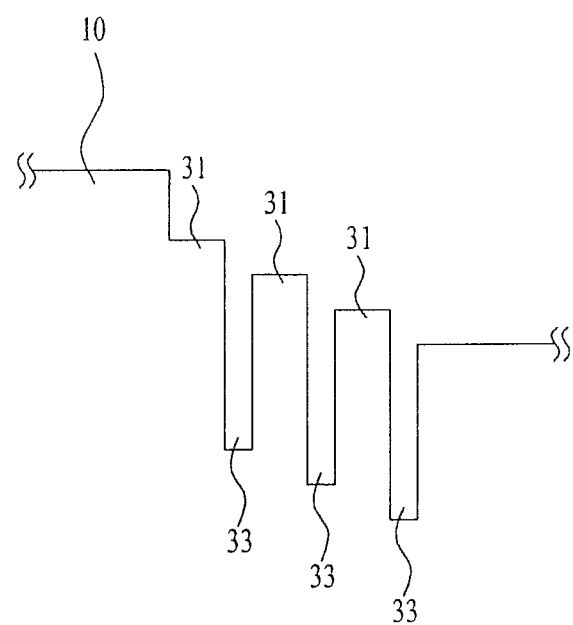

FIG. 12 illustrates an energy band diagram according to the lattice constant difference in FIG. 9, wherein, as shown in FIG. 12, it can be known that the energy band gaps of the quantum barrier layer 31 and the quantum well layer 33 become the smaller gradually as the quantum barrier layer 31 and the quantum well layer 33 become the farther from any one of the first and second conduction type semiconductor layers 10 and 50.

Figure 13:
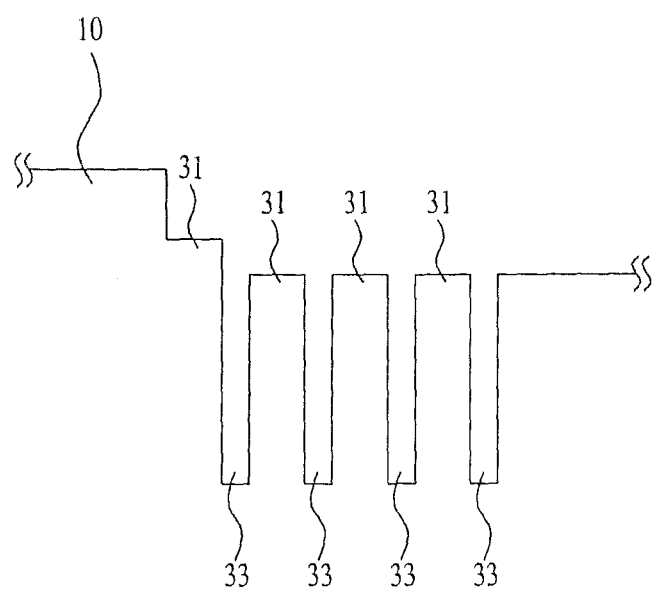
Figure 14:
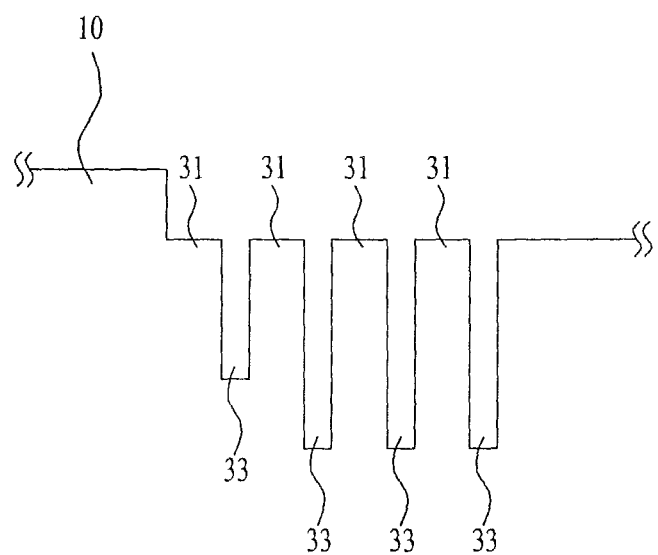

FIGS. 13 and 14 illustrate energy band diagrams according to other embodiments respectively, wherein FIG. 13 illustrates a diagram showing at least any one of the quantum barrier layers 31 can have a different energy band gap, excluding a first quantum barrier layer 31 adjacent to the first, second conduction type semiconductor layer 10, 50, and FIG. 14 illustrates a diagram showing at least any one of the quantum well layers 33 can have a different energy band gap, excluding a first quantum well layer 33 adjacent to the first, second conduction type semiconductor layer 10, 50.

Figure 15:
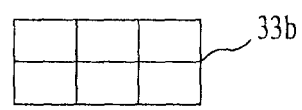
FIGS. 15 to 17 illustrate schematic views of lattice constant differences of respective layers of light emitting devices in accordance with another preferred embodiment of the present invention, respectively.
Figure 15:
Figure 15:
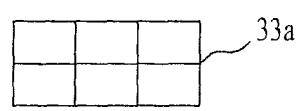
Figure 15:
Figure 15:
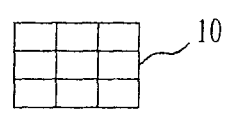
Figure 16:
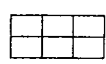
Figure 16:
Figure 16:
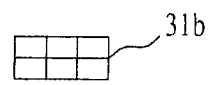
Figure 16:
Figure 16:
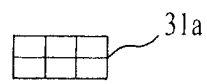
Figure 16:
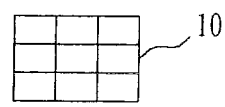
Figure 17:
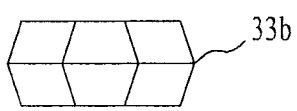
Figure 17:
Figure 17:
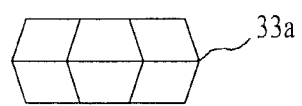
Figure 17:
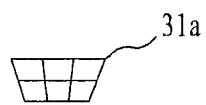
Figure 17:
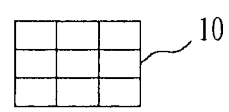

FIGS. 15 to 17 illustrate schematic views of lattice constant differences of respective layers of light emitting devices in accordance with another preferred embodiment of the present invention, respectively.

Referring to FIGS. 15 to 17, the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the face direction lattice constant of at least any one of the quantum barrier layer 31 and the quantum well layer 33 can be formed to vary in a thickness direction with a gradient.

FIG. 15 illustrates a schematic view showing that the face direction lattice constant of a first quantum barrier layer 31a becomes greater gradually in a thickness direction from the first conduction type semiconductor layer 10 or the second conduction type semiconductor layer 50 to the quantum well layer 33a, and the face direction lattice constant of a second quantum barrier layer 31b becomes smaller gradually in a thickness direction from an edge thereof to middle thereof, wherein, though all of the quantum well layers 33 have the indium contents the same with each other, the quantum barrier layers 31 have the indium contents varied gradually in the thickness direction.

That is, in a case of the first quantum barrier layer 31a positioned between the first conduction type semiconductor layer 10 or the second conduction type semiconductor layer 50 and the quantum well layer 33a, the indium content becomes greater gradually in the thickness direction from the first, second conduction type semiconductor layer 10, 50 to the quantum well layer 33a.

And, in a case of the second quantum barrier layer 31b positioned between the first quantum well layer 33a and the second quantum well layer 33b, the indium content becomes smaller gradually in the thickness direction from an edge to middle of the second quantum barrier layer 31b.

FIG. 16 illustrates a schematic view showing that the face direction lattice constant of the quantum well layer 33 becomes greater gradually in a thickness direction from an edge to middle of the quantum well layer 33, wherein, though all of the quantum barrier layers 31 have the indium content the same with each other, the quantum well layers 33 have the indium contents gradually varied in the thickness direction.

That is, in a case of the quantum well layer 33 positioned between the first quantum barrier layer 31a and the second quantum barrier layer 31b, the indium content becomes greater gradually in a thickness direction from an edge to middle of the quantum well layer 33.

FIG. 17 illustrates a schematic view showing that a difference of the face direction lattice constants inclusive of the quantum barrier layer 31 in FIG. 15 and the quantum well layer 33 in FIG. 16, wherein the indium contents both of the quantum barrier layer 31 and the quantum well layer 33 vary gradually in the thickness direction, respectively.

Figure 18:
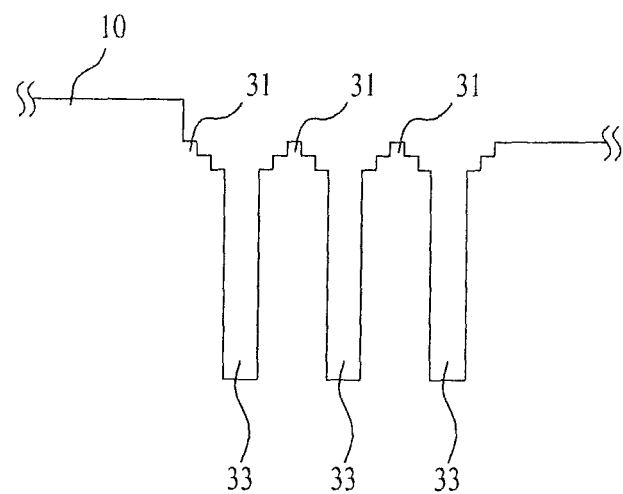
FIGS. 18 to 20 illustrate energy band diagrams according to FIGS. 15 to 17, respectively.
Figure 19:
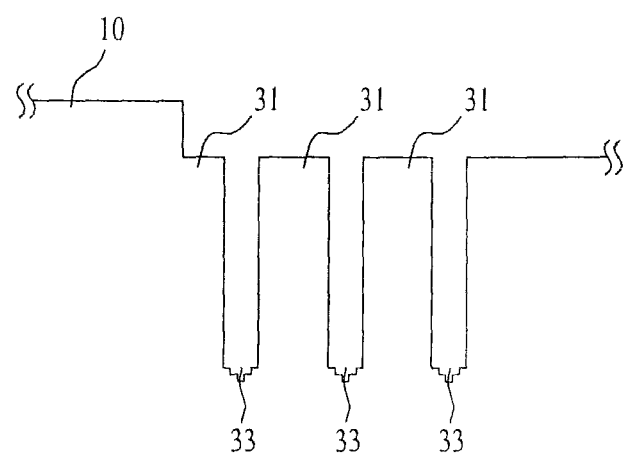
Figure 20:
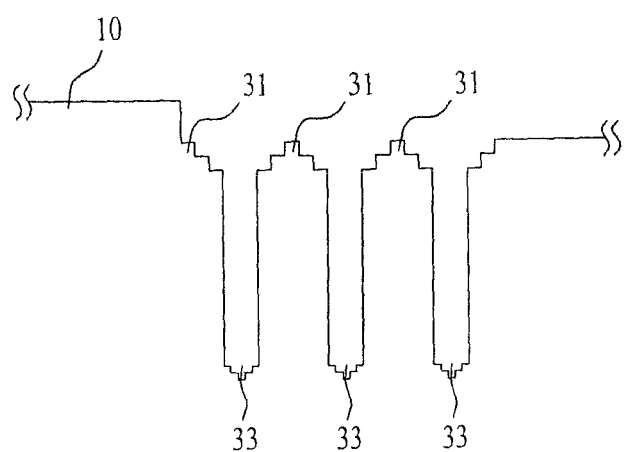

FIGS. 18 to 20 illustrate energy band diagrams according to FIGS. 15 to 17, respectively.

FIG. 18 illustrates an energy band diagram according to the lattice constant difference in FIG. 15, FIG. 19 illustrates an energy band diagram according to the lattice constant difference in FIG. 16 and FIG. 20 illustrates an energy band diagram according to the lattice constant difference in FIG. 17.

Referring to FIGS. 18 to 20, it can be known that the energy ban gaps of the quantum barrier layer 31 and the quantum well layer 33 vary gradually in the thickness directions.

Figure 21:
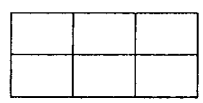
FIGS. 21 to 23 illustrate schematic views of lattice constant differences of respective layers of light emitting devices in accordance with another preferred embodiment of the present invention, respectively.
Figure 21:
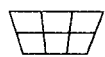
Figure 21:
Figure 21:
Figure 21:
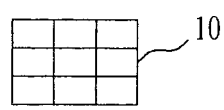
Figure 22:
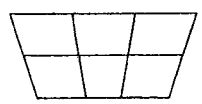
Figure 22:
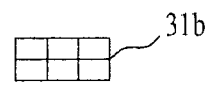
Figure 22:
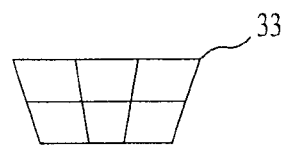
Figure 22:
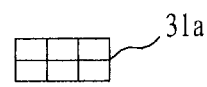
Figure 22:
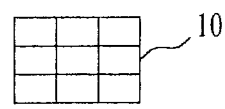
Figure 23:
Figure 23:
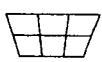
Figure 23:
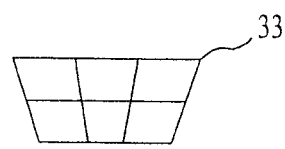
Figure 23:
Figure 23:
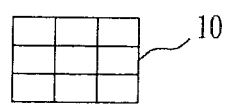

FIGS. 21 to 23 illustrate schematic views of lattice constant differences of respective layers of light emitting devices in accordance with another preferred embodiment of the present invention, respectively.

Referring to FIGS. 21 to 23, the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the face direction lattice constant of at least any one of the quantum barrier layer 31 and the quantum well layer 33 can be formed to vary in a thickness direction with a gradient.

FIG. 21 illustrates a schematic view showing that the face direction lattice constant of the quantum barrier layer 31 becomes greater gradually in a thickness direction from the first conduction type semiconductor layer 10 or the second conduction type semiconductor layer 50 to the quantum well layer 33, wherein, though all of the quantum well layers 33 have the indium contents the same with each other, the quantum barrier layers 31 have the indium contents which become greater gradually in the thickness direction from the first conduction type semiconductor layer 10 or the second conduction type semiconductor layer 50 to the quantum well layer 33.

That is, in a case of the first quantum barrier layer 31 positioned between the first conduction type semiconductor layer 10 or the second conduction type semiconductor layer 50 and the quantum well layer 33, the first quantum barrier layer 31 can be formed such that the indium content at an interface of the quantum barrier layer 31 adjacent to the quantum well layer 33 is greater than the indium content at an interface of the quantum barrier layer adjacent to the first, second conduction type semiconductor layer 10, 50.

FIG. 22 illustrates a schematic view showing that the face direction lattice constant of the quantum well layer 33 becomes greater gradually in a thickness direction from the first quantum barrier layer 31a to the second quantum barrier layer 31, wherein, though all of the quantum barrier layers 31 have the indium contents the same with each other, the quantum well layer 33 have the indium contents which become greater gradually in the thickness direction from the first quantum barrier layer 31a to the second quantum barrier layer 31b.

That is, in a case of the quantum well layer 33 positioned between the first quantum barrier layer 31a and the second quantum barrier layer 31b, the quantum well layer 33 can be formed such that the indium content at an interface of the quantum well layer 33 adjacent to the first quantum barrier layer 31a is greater than the indium content at an interface of the quantum well layer 33 adjacent to the second quantum barrier layer 31b.

FIG. 23 illustrates a schematic view showing that the face direction lattice constants of the quantum barrier layer 31 and the quantum well layer 33 become greater gradually in a thickness direction in which the quantum barrier layer 31 and the quantum well layer 33 become farther from the first, second conduction type semiconductor layer 10, 50, wherein the quantum barrier layer 31 and the quantum well layer 33 have the indium contents which become greater gradually in the thickness direction in which the quantum barrier layer 31 and the quantum well layer 33 become farther from the first, second conduction type semiconductor layer 10, 50.

Figure 24:
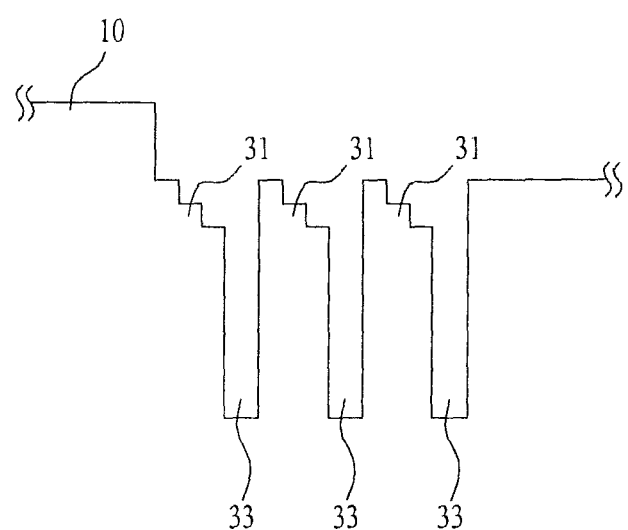
FIGS. 24 to 26 illustrate energy band diagrams according to FIGS. 21 to 23, respectively.
Figure 25:
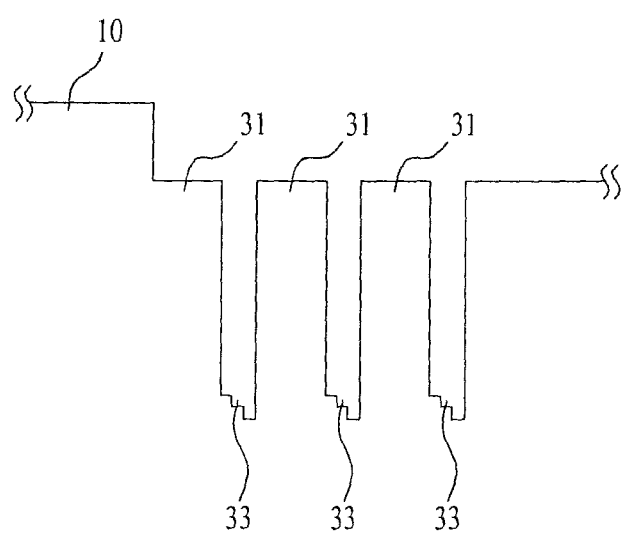
Figure 26:
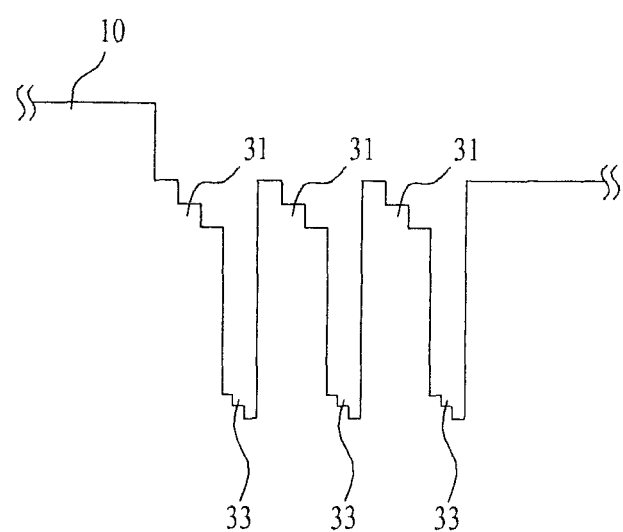

FIGS. 24 to 26 illustrate energy band diagrams according to FIGS. 21 to 23, respectively.

FIG. 24 illustrates an energy band diagram according to the lattice constant difference in FIG. 21, FIG. 25 illustrates an energy band diagram according to the lattice constant difference in FIG. 22, and FIG. 26 illustrates an energy band diagram according to the lattice constant difference in FIG. 23.

Referring to FIGS. 24 to 26, it can be known that the energy band gaps of the quantum barrier layer 31 and the quantum well layer 33 vary gradually in the thickness directions.

Figure 27:
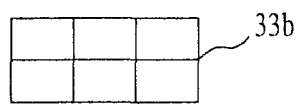
FIGS. 27 to 29 illustrate schematic views of lattice constant differences of respective layers of light emitting devices in accordance with another preferred embodiment of the present invention, respectively.
Figure 27:
Figure 27:
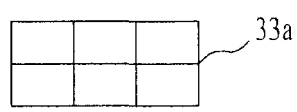
Figure 27:
Figure 27:
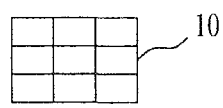
Figure 28:
Figure 28:
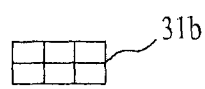
Figure 28:
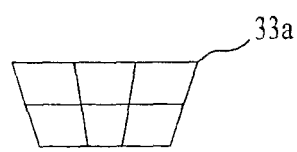
Figure 28:
Figure 28:
Figure 29:
Figure 29:
Figure 29:
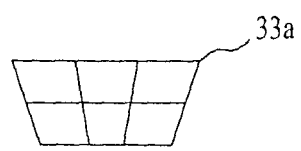
Figure 29:
Figure 29:
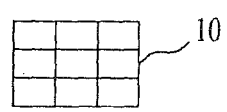

FIGS. 27 to 29 illustrate schematic views of lattice constant differences of respective layers of light emitting devices in accordance with another preferred embodiment of the present invention, respectively.

Referring to FIGS. 27 to 29, the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the face direction lattice constant of at least any one of the quantum barrier layer 31 and the quantum well layer 33 can be formed to vary in a thickness direction with a gradient.

In this instance, FIG. 27 illustrates a schematic view showing that the face direction lattice constant of the first quantum barrier layer 31a becomes greater gradually in a thickness direction from the first conduction type semiconductor layer 10 or the second conduction type semiconductor layer 50 to the first quantum well layer 33a, and the face direction lattice constant of a second quantum barrier layer 31b becomes smaller gradually in a thickness direction from the first quantum well layer 33a to the second quantum well layer 33b, wherein, though all of the quantum well layers 33 have the indium contents the same with each other, the quantum barrier layers 31 have the indium contents varied gradually in the thickness direction.

That is, in a case of the first quantum barrier layer 31a positioned between the first conduction type semiconductor layer 10 or the second conduction type semiconductor layer 50 and the first quantum well layer 33a, the indium content becomes greater gradually in the thickness direction from the first, second conduction type semiconductor layer 10, 50 to the first quantum well layer 33a.

And, in a case of the second quantum barrier layer 31b positioned between the first quantum well layer 33a and the second quantum well layer 33b, the indium content becomes smaller gradually in the thickness direction from the first quantum well layer 33a to the second quantum well layer 33b.

FIG. 28 illustrates a schematic view showing that the face direction lattice constant of the first quantum well layer 33a becomes greater gradually in a thickness direction from the first quantum barrier layer 31a to the second quantum barrier layer 31b, and the face direction lattice constant of the second quantum well layer 33b becomes smaller gradually in the thickness direction, wherein, though all of the quantum barrier layers 31 have the same indium content with each other, the quantum well layers 33 have the indium contents gradually varied in the thickness direction.

That is, in a case of the first quantum well layer 33a positioned between the first quantum barrier layer 31a and the second quantum barrier layer 31b, the indium content becomes greater gradually in the thickness direction, and in a case of the second quantum well layer 33b positioned between the second quantum barrier layer 31b and the third quantum barrier layer, the indium content becomes smaller gradually in the thickness direction.

FIG. 29 illustrates a schematic view showing that a difference of the face direction lattice constants inclusive of the quantum barrier layer 31 in FIG. 27 and the quantum well layer 33 in FIG. 29, wherein the indium contents both of the quantum barrier layer 31 and the quantum well layer 33 vary gradually in the thickness direction, respectively.

Figure 30:
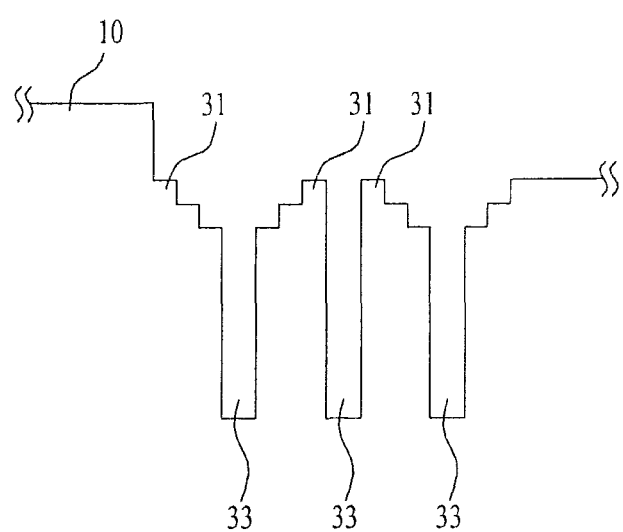
FIGS. 30 to 32 illustrate energy band diagrams of the light emitting devices in FIGS. 27 to 29, respectively.
Figure 31:
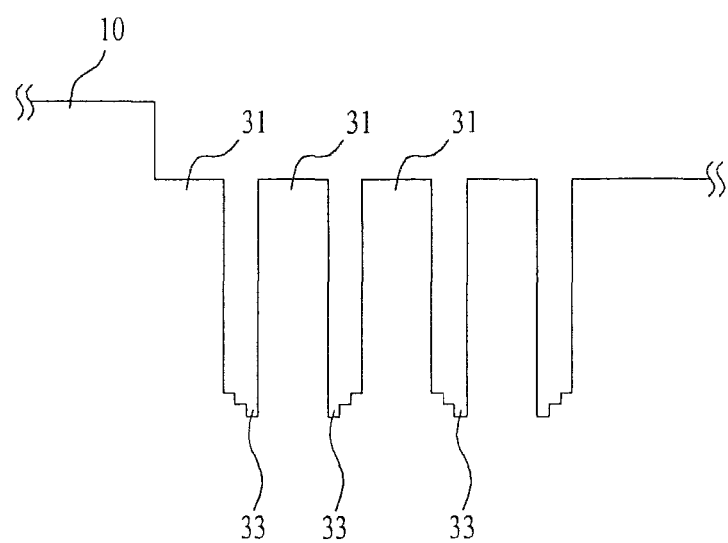
Figure 32:
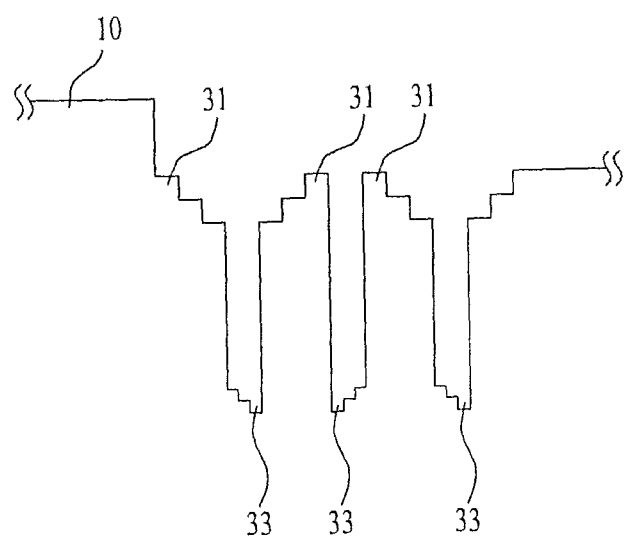

FIGS. 30 to 32 illustrate energy band diagrams according to FIGS. 27 to 29, respectively.

FIG. 30 illustrates an energy band diagram according to the lattice constant difference in FIG. 27, FIG. 31 illustrates an energy band diagram according to the lattice constant difference in FIG. 28, and FIG. 32 illustrates an energy band diagram according to the lattice constant difference in FIG. 29.

Referring to FIGS. 30 to 32, it can be known that the energy band gaps of the quantum barrier layer 31 and the quantum well layer 33 vary gradually in the thickness directions, respectively.

Thus, in the embodiments of the present invention, by forming the face direction lattice constant of the semiconductor layer to be greater than the face direction lattice constant of the quantum barrier layer and smaller than the face direction lattice constant of the quantum well layer, a tensile stress of the quantum barrier layer with respect to the semiconductor layer compensates for a compressive stress of the quantum well layer with respect to the semiconductor layer.

That is, owing to the semiconductor layer having the face direction lattice constant between the quantum well layer and the quantum barrier layer, the quantum barrier layer having the tensile stress serves as a stress buffering layer which buffers the compressive stress of the quantum well layer.

Eventually, such moderation of the internal stress reduces the internal stress field exerting in the quantum well layer, to reduce the spatial separation of a wave function of the electrons and holes in the quantum well layer at the end, enhancing the spontaneous emission efficiency of the light emitting device.

And, by forming the face direction lattice constants of the quantum barrier layer and the quantum well layer to vary in the thickness direction with gradients respectively, an energy band structure in which injection of the electrons and quantum's is smooth, a high efficiency light emitting device having improved light emission efficiency can be fabricated.

Figure 33A:
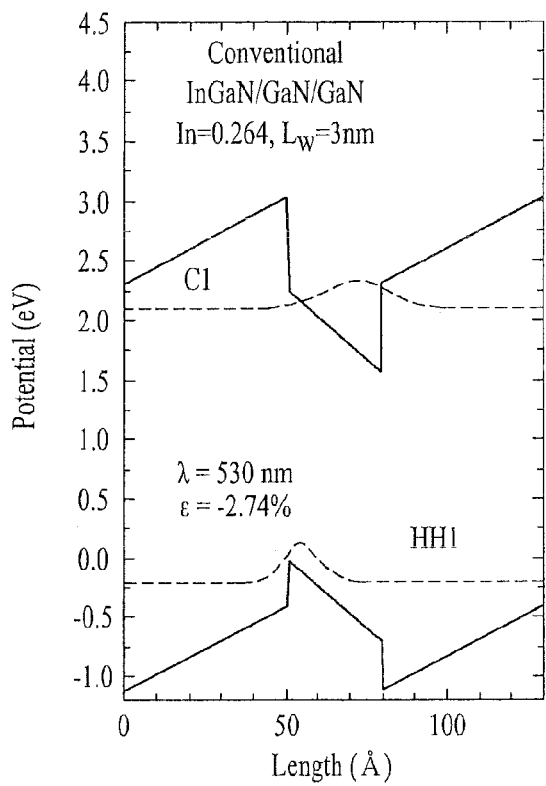
FIGS. 33A and 33B illustrate graphs for comparing compressive stresses of a conventional quantum well structure to a stress-compensated quantum well structure of the present invention.
Figure 33B:
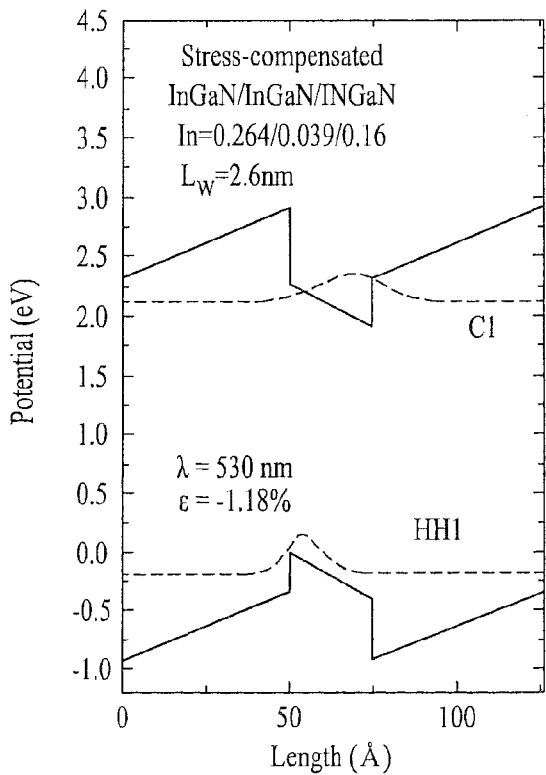

FIGS. 33A and 33B illustrate graphs for comparing compressive stresses of a conventional quantum well structure and a stress-compensated quantum well structure of the present invention.

FIG. 33A illustrates a graph showing potential profiles and wave function distributions of a first conduction band sub-band C1 and a first valence band sub-band HH1 of an InGaN/GaN quantum well structure on a conventional GaN semiconductor layer, and FIG. 33B illustrates a graph showing potential profiles and wave function distributions of a first conduction band sub-band C1 and a first valence band sub-band HH1 of an InGaN/InGaN quantum well structure on a stress-compensated GaN semiconductor layer of the present invention.

The conventional quantum well structure forms a large internal field due to an intensive compressive stress exerting in the InGaN quantum well structure, to deform the energy band structure of the InGaN quantum well structure.

Accordingly, referring to FIG. 33A, a slope of the energy band is steep due to the deformation of the energy band structure, and the conventional quantum well structure has a compressive stress of about 2.74%.

Opposite to this, in the stress-compensated quantum well structure of the present invention, since the face direction lattice constant of the InGaN semiconductor layer is greater than the face direction lattice constant of the quantum barrier layer, and smaller than the face direction lattice constant of the quantum well layer, the tensile stress exerting in the quantum barrier layer compensates for the compressive stress exerting in the quantum well layer partially, reducing the internal stress field exerting in the quantum well layer.

Accordingly, referring to FIG. 33B, it can be noted that the stress-compensated quantum well structure of the present invention has the slope of the energy band more moderate than the conventional quantum well structure, and the compressive stress of about 1.18% which is smaller than the conventional quantum well structure.

Figure 34:
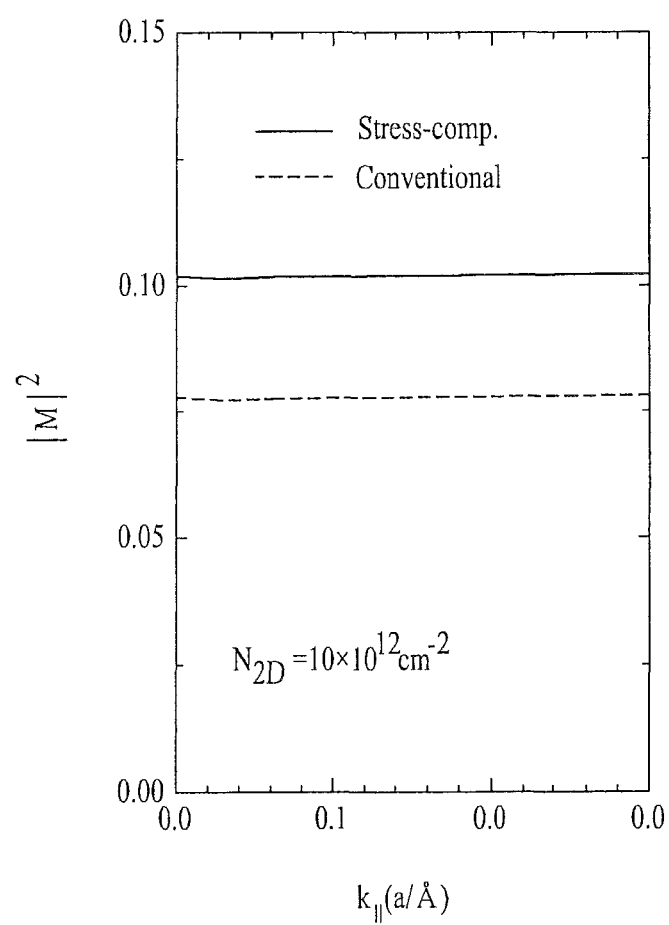
FIG. 34 illustrates a graph for comparing optical matrix element quantities of a conventional quantum well and a stress-compensated quantum well of the present invention expressed with face direction wave vector functions, respectively.
Figure 35:
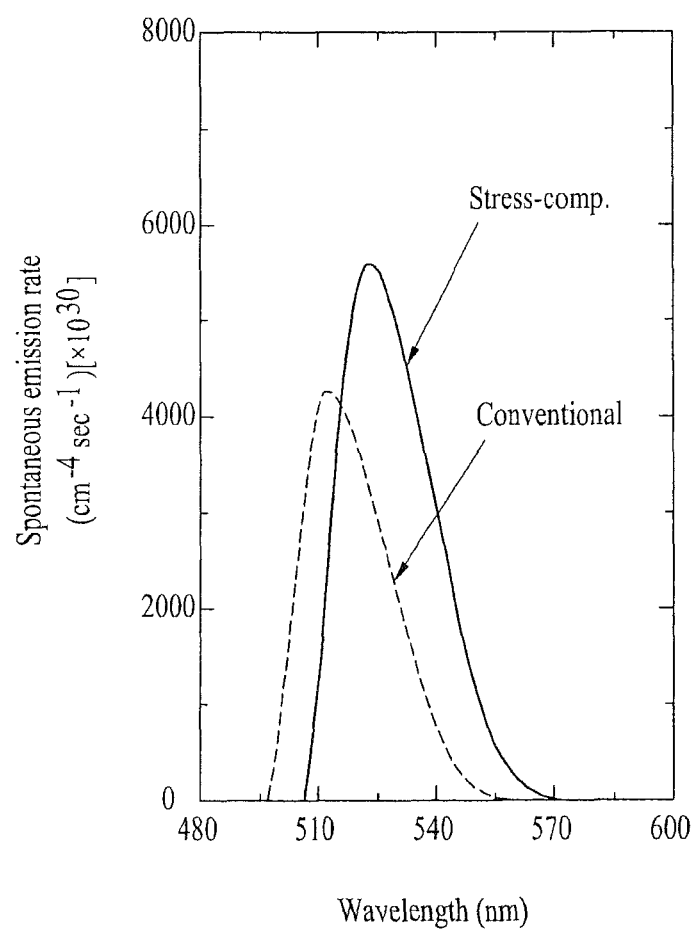
FIG. 35 illustrates a graph for comparing spontaneous emission rates of a conventional quantum well and a stress-compensated quantum well.

FIG. 34 illustrates a graph for comparing numbers of optical matrix elements of a conventional quantum well structure and a stress-compensated quantum well structure of the present invention expressed with face direction wave vector functions respectively, and FIG. 35 illustrates a graph for comparing spontaneous emission rates of a conventional quantum well structure and a stress-compensated quantum well structure.

Referring to FIG. 34, it can be known that the optical matrix elements of the stress-compensated quantum well structure of the present invention are more than the optical matrix elements of the conventional quantum well structure.

This is resulted from reduction of an extent of mismatch of the crystal lattices, which reduces the internal stress field in the active layer.

At the end, referring to FIG. 35, it can be known that the spontaneous emission efficiency of the light emitting device having the stress-compensated quantum well structure of the present invention increases substantially compared to the spontaneous emission efficiency of the light emitting device having the conventional quantum well structure.

Figure 36:
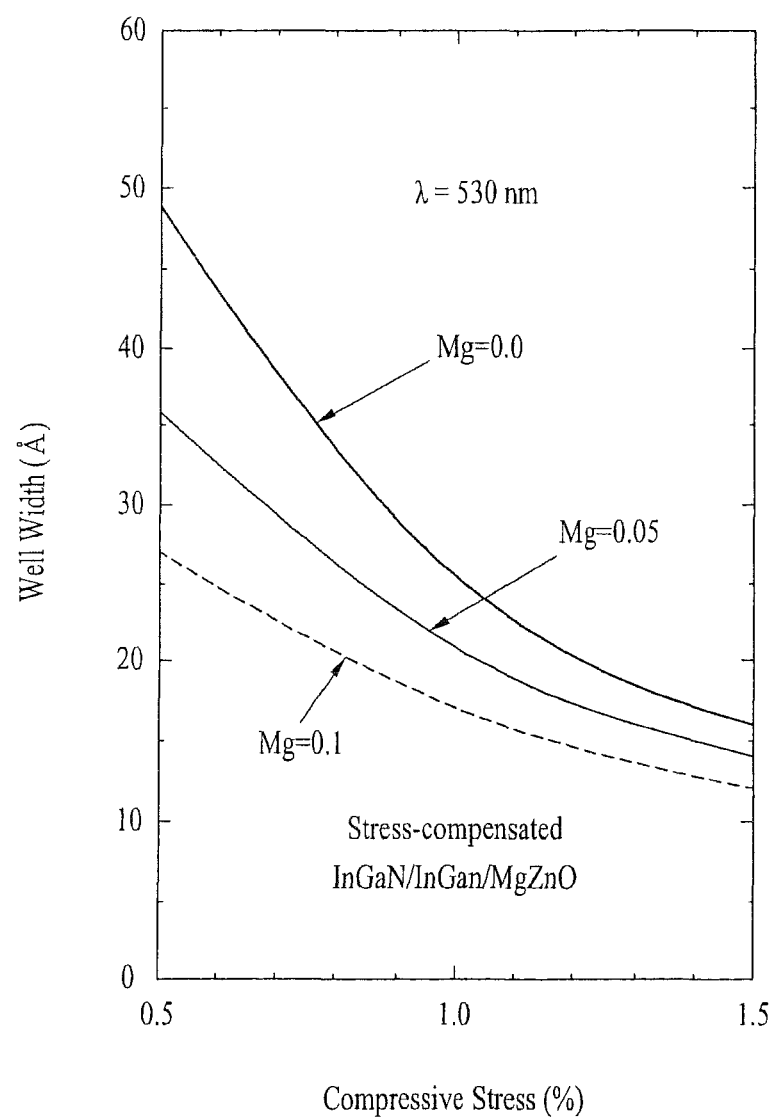
FIGS. 36 and 37 illustrate graphs each showing an extent of a compressive stress exerting in a quantum well according to an Mg ratio in an MgZnO semiconductor layer.
Figure 37:
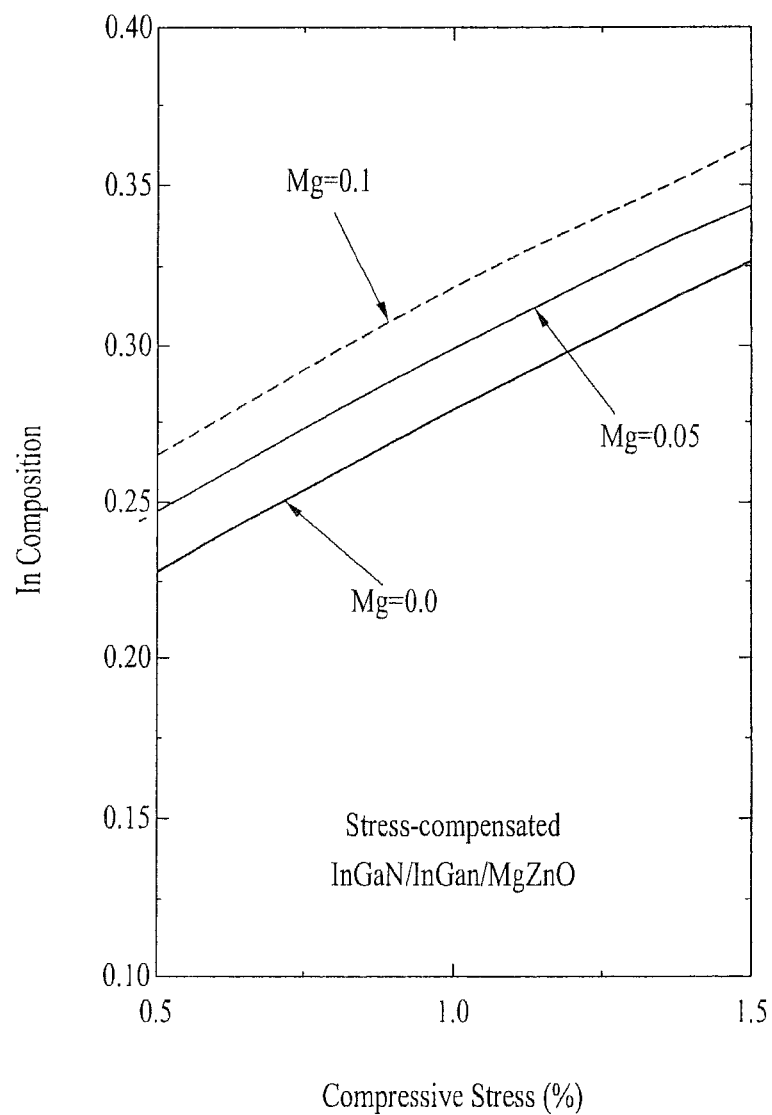

FIGS. 36 and 37 illustrate graphs each showing an extent of a compressive stress exerting in a quantum well according to an Mg ratio in an MgZnO semiconductor layer.

FIG. 36 illustrates a graph showing an extent of a compressive stress exerting in a quantum well according to an Mg ratio in an MgZnO semiconductor layer for a fixed thickness of the quantum well, and FIG. 37 illustrates a graph showing an extent of a compressive stress exerting in a quantum well according to an Mg ratio in an MgZnO semiconductor layer for fixed indium composition of the quantum well.

Referring to FIGS. 36 and 37, it can be known that as the Mg ratio in the MgZnO semiconductor layer increases, the compressive stress exerting in the quantum well reduces.

FIGS. 36 and 37 illustrate graphs of embodiments each showing a result of a stress exerting in the quantum well calculated when an Mg fraction is in a range of about 0~0.1 in a case of a green LED with a light emission wavelength of about 530 nm, wherein it can be known that the thinner the thickness of the quantum well and the higher the flow rate of the indium, the greater the stress exerting in the quantum well.

Figure 38:
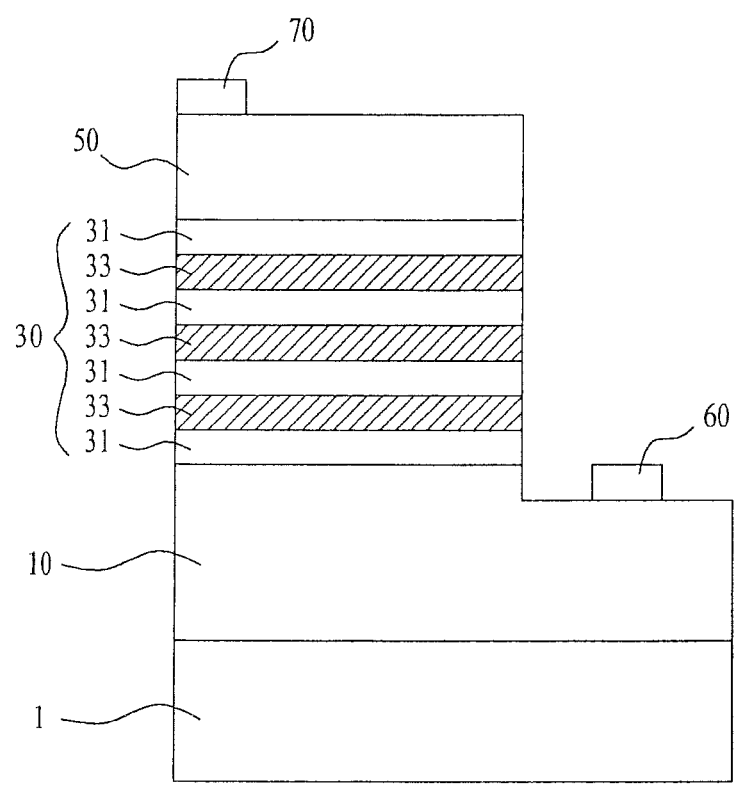
FIG. 38 illustrates a section of a horizontal type light emitting device having a stress-compensated quantum well structure.

FIG. 38 illustrates a section of a horizontal type light emitting device having a stress-compensated quantum well structure.

Referring to FIG. 38, the horizontal type light emitting device includes a first conduction type semiconductor layer 10, an active layer 30, and a second conduction type semiconductor layer 50 formed on a substrate 1, wherein the active layer 30 includes quantum well layers 33 and quantum barrier layers 31.

There are a first electrode 60 on the first conduction type semiconductor layer 10, and a second electrode 70 on the second conduction type semiconductor layer 50.

In this instance, the quantum barrier layer 31 has a tensile stress with respect to the first conduction type semiconductor layer 10 or the second conduction type semiconductor layer 50, and the quantum well layer 33 has a compressive stress with respect to the first conduction type semiconductor layer 10 or the second conduction type semiconductor layer 50.

And, it is preferable that the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the substrate 1 can be formed of a light transmissive material, for an example, sapphire $Al_2O_3$, GaN, SiC, ZnO, Si, GaP, InP, $Ga_2O_3$, and GaAs.

And, an undoped semiconductor layer (not shown) can be included to an underside of the first conduction type semiconductor layer 10, additionally. However, the present invention is not limited to above.

The first conduction type semiconductor layer 10 can be formed of one selected from GaN, AlN, AlGaN, InGaN, InN, InAlGaN, and AlInN, and n type dopant, such as Si, Ge, Sn, Se, Te, can be doped thereto.

The undoped semiconductor layer which is a layer formed to improve crystallinity of the first conduction type semiconductor layer 10 can the same with the first conduction type semiconductor layer 10 except that the undoped semiconductor layer has electric conductivity lower than the first conduction type semiconductor layer 10 since the n type dopant is not doped thereto.

And, the active layer 30 can include at least one of a quantum wire structure, a quantum dot structure, a single quantum well structure, or a multi quantum well structure MQW.

The active layer 30 can generate a light with energy generated by a recombination process of electrons and holes provided from the first conduction type semiconductor layer 10 and the second conduction type semiconductor layer 50.

Then, the second conduction type semiconductor layer 50 can be formed of one selected from GaN, AlN, AlGaN, InGaN, InN, InAlGaN, AlInN, and p type dopant, such as Mg, Zn, Ca, Sr, Ba, can be doped thereto.

In this instance, different from above description, the first conduction type semiconductor layer 10 can be a p type semiconductor layer and the second conduction type semiconductor layer 50 can be an n type semiconductor layer.

And, there can be a third conduction type semiconductor layer (not shown) including an n type or p type semiconductor layer formed on the first conduction type semiconductor layer 10, making the light emitting device of the present invention to have at least one of junction structure of np, pn, npn, and pnp.

A doping concentration of the conductive dopant in the first conduction type semiconductor layer 10 and the second conduction type semiconductor layer 50 may or may not be uniform.

That is, structures of the plurality of semiconductor layers can vary, and are not limited to above.

And, each of the first electrode 60 and the second electrode 70 can be single layer or multi-layer of at least one of aluminum Al, titanium Ti, chromium Cr, nickel Ni, copper Cu, and gold Au.

Figure 39:
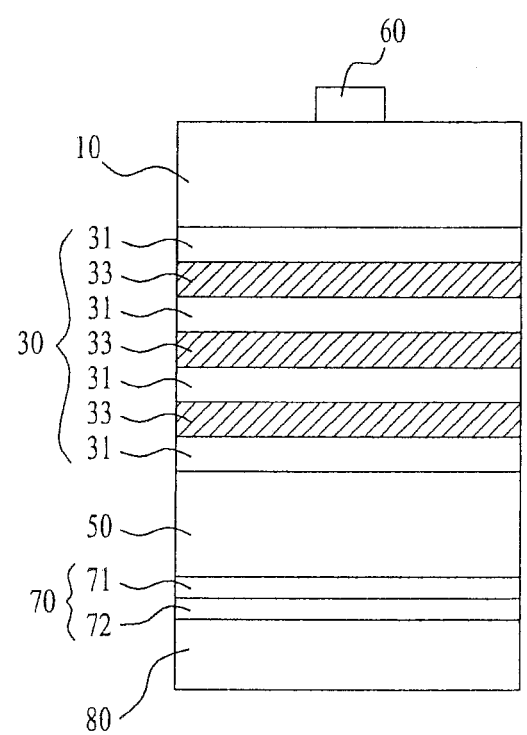
FIG. 39 illustrates a section of a vertical type light emitting device having a stress-compensated quantum well structure.

FIG. 39 illustrates a section of a vertical type light emitting device having a stress-compensated quantum well structure.

Referring to FIG. 39, the vertical type light emitting device includes a second conduction type semiconductor layer 50, an active layer 30, and a first conduction type semiconductor layer 10, formed on a supporting layer 80 of a metal or conduction type semiconductor layer wherein the active layer 30 includes quantum well layers 33 and quantum well layers 33.

There are a first electrode 60 on the first conduction type semiconductor layer 10, and a second electrode 70 between the second conduction type semiconductor layer 50 and the supporting layer 80.

The second electrode 70 can have an ohmic electrode 71 and a reflective electrode 72, and the ohmic electrode 71 can be a transparent electrode.

In this instance, the quantum barrier layer 31 has a tensile stress with respect to the first conduction type semiconductor layer 10 or the second conduction type semiconductor layer 50, and the quantum well layer 33 has a compressive stress with respect to the first conduction type semiconductor layer 10 or the second conduction type semiconductor layer 50.

And, it is preferable that the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

Figure 40:
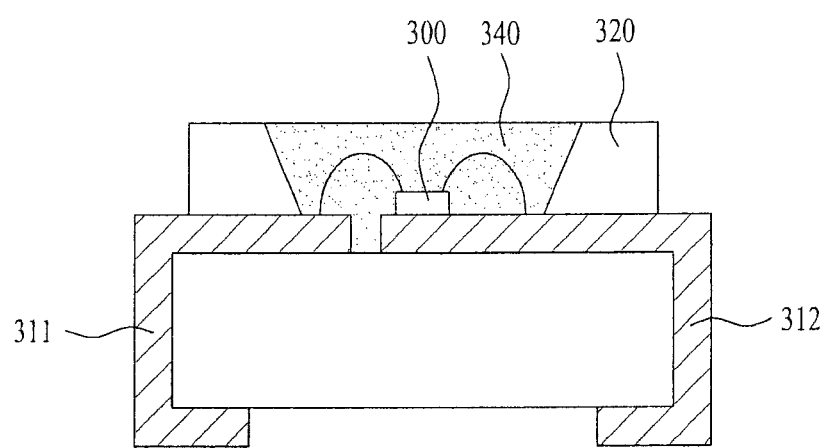
FIG. 40 illustrates a section of a hybrid type light emitting device having a stress-compensated quantum well structure.

FIG. 40 illustrates a section of a hybrid type light emitting device having a stress-compensated quantum well structure.

Referring to FIG. 40, the hybrid type light emitting device includes a first conduction type semiconductor layer 10, an active layer 30, and a second conduction type semiconductor layer 50, formed on a substrate 1, wherein the active layer 30 includes quantum well layers 33 and quantum barrier layers 31.

There are a first electrode 60 formed on the first conduction type semiconductor layer 10, and a second electrode 70 formed between the substrate 1 and the second conduction type semiconductor layer 50 to be in contact with the a second conduction type semiconductor layer 50 through the first conduction type semiconductor layer 10 and the an active layer 30.

That is, the second electrode 70 is in contact with the second conduction type semiconductor layer 50 through a hole formed to pass through the first conduction type semiconductor layer 10 and the an active layer 30.

At a side of the hole, there is an insulating film coated thereon for insulating the second electrode 70 electrically.

The quantum barrier layer 31 has a tensile stress with respect to the first conduction type semiconductor layer 10 or the second conduction type semiconductor layer 50, and the quantum well layer 33 has a compressive stress with respect to the first conduction type semiconductor layer 10 or the second conduction type semiconductor layer 50.

And, it is preferable that the face direction lattice constant of the first conduction type semiconductor layer 10 or the second conduction type semiconductor layer 50 is greater than the face direction lattice constant of the quantum barrier layer 31 and smaller than the face direction lattice constant of the quantum well layer 33.

And, the substrate 1 can be formed of a light transmissive material, for an example, sapphire $Al_2O_3$, GaN, SiC, ZnO, Si, GaP, InP, $Ga_2O_3$, and GaAs.

And, an undoped semiconductor layer (not shown) can be included to between the first conduction type semiconductor layer 10 and the second electrode 70, additionally. However, the present invention is not limited to above.

The first conduction type semiconductor layer 10 can be formed of one selected from GaN, AlN, AlGaN, InGaN, InN, InAlGaN, and AlInN, and n type dopant, such as Si, Ge, Sn, Se, and Te can be doped thereto.

The undoped semiconductor layer which is a layer formed to improve crystallinity of the first conduction type semiconductor layer 10 can the same with the first conduction type semiconductor layer 10 except that the undoped semiconductor layer has electric conductivity lower than the first conduction type semiconductor layer 10 since the n type dopant is not doped thereto.

And, the active layer 30 can include at least one of a quantum wire structure, a quantum dot structure, a single quantum well structure, or a multi quantum well structure MQW.

The active layer 30 can generate a light with energy generated by a recombination process of electrons and holes provided from the first conduction type semiconductor layer 10 and the second conduction type semiconductor layer 50.

Then, the second conduction type semiconductor layer 50 can be formed of one selected from GaN, AlN, AlGaN, InGaN, InN, InAlGaN, and AlInN, and p type dopant, such as Mg, Zn, Ca, Sr, and Ba can be doped thereto.

In this instance, different from above description, the first conduction type semiconductor layer 10 can be a p type semiconductor layer and the second conduction type semiconductor layer 50 can be an n type semiconductor layer.

And, there can be a third conduction type semiconductor layer (not shown) including an n type or p type semiconductor layer formed on the first conduction type semiconductor layer 10, making the light emitting device of the present invention to have at least any one of junction structures of np, pn, npn, and pnp.

And, a doping concentration of the conductive dopant in the first conduction type semiconductor layer 10 and the second conduction type semiconductor layer 50 may or may not be uniform.

That is, structures of the plurality of semiconductor layers can vary, and are not limited to above.

And, each of the first electrode 60 and the second electrode 70 can be single layer or multi-layer at least one of aluminum Al, titanium Ti, chromium Cr, nickel Ni, copper Cu, and gold Au.

The embodiments configured thus moderate the compressive stress exerting in the quantum well layer in the active layer, improving the spontaneous emission efficiency of the quantum well layer significantly, enabling to provide a high efficiency light emitting device.

Figure 41:
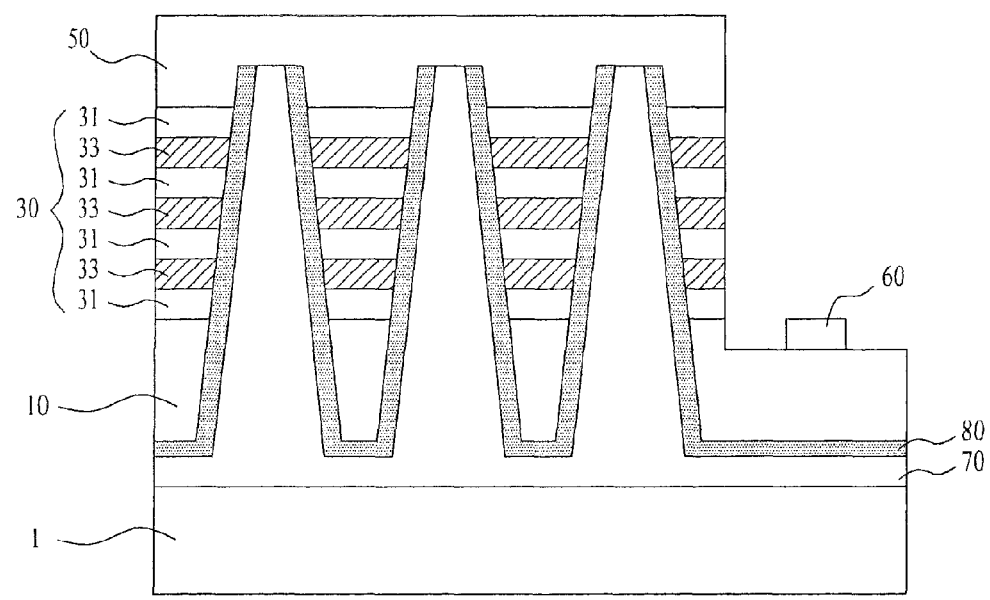
FIG. 41 illustrates a section of a light emitting device package in accordance with a preferred embodiment of the present invention.

FIG. 41 illustrates a section of a light emitting device package in accordance with a preferred embodiment of the present invention.

Referring to FIG. 41, the light emitting device package includes a package body 320, a first electrode layer 311 and a second electrode layer 312 mounted to the package body 320, a light emitting device 300 of an embodiment in which the light emitting device 300 is electrically connected to the first electrode layer 311 and the second electrode layer 312 mounted to the package body 320, and a filling material 340 for enclosing the light emitting device 300.

In this instance, the package body 320 can be formed including a silicone material, a synthetic resin material, or a metal material, and has a sloped surface around the light emitting device 300, enabling to enhance light extraction efficiency.

The first electrode layer 311 and the second electrode layer 312 are separated from each other, and provide power to the light emitting device 300.

Moreover, the first electrode layer 311 and the second electrode layer 312 reflect a light from the light emitting device 300, enabling to increase optical efficiency, and can also serve to disperse heat from the light emitting device 300 to an outside of the light emitting device package.

The light emitting device 300 can be mounted on the package body 320, or the first electrode layer 311 or the second electrode layer 312.

The light emitting device 300 can be electrically connected to the first electrode layer 311 and the second electrode layer 312 by any one of wiring, flip chip bonding, and die bonding.

And, the filling material 340 encloses the light emitting device 300 enabling to protect the light emitting device 300.

And, the filling material 340 includes a fluorescent material for changing a wavelength of the light from the light emitting device 300.

The light emitting device package can have at least one of the light emitting devices in the embodiments disclosed above, but the present invention is not limited to above.

A plurality of the light emitting device packages of the embodiment form an array on a substrate, and optical members, such as a light plate, a prism sheet, a diffusion sheet, and so on, can be arranged on an optical path of the light emitting device package.

The light emitting device package, the substrate, the optical members can function as a lighting unit.

Another embodiment can be embodied as a display device, an indicating device or an illumination system including the semiconductor light emitting device or the light emitting device package described in above embodiments, and, for an example, the illumination system can include lamps and road lamps.

The illumination system can be used as an illumination lamp by putting a plurality of the LEDs together, especially, as a downlight buried in a ceiling or wall of a building to have an opening side of a shade thereof exposed to an outside of the ceiling or the wall.

Figure 42:
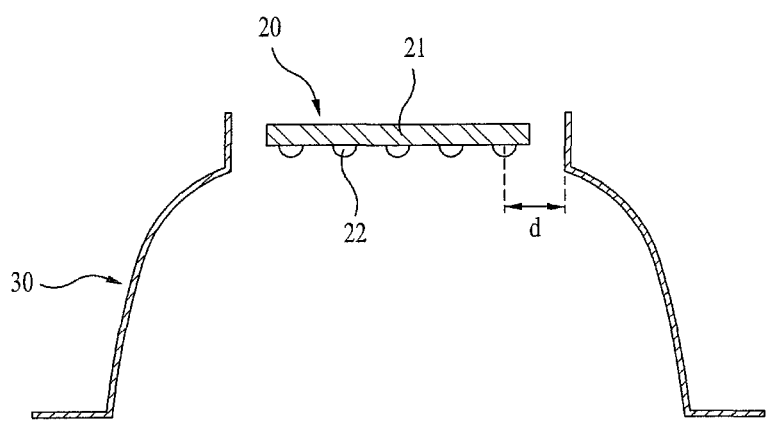
FIG. 42 illustrates a section showing an embodiment of a lighting fixture with a light emitting device.

FIG. 42 illustrates a section showing an embodiment of a lighting fixture with a light emitting device. As shown in FIG. 42, the lighting fixture includes an LED (Light Emitting diode) light source 20, and a shade 30 for setting an emitting direction angle of a light from the LED light source 20.

The LED light source 20 can include at least one LED 22 provided on a PCB (Printed Circuit Board) 21, or a plurality of the LEDs 22 provided on the PCB 21.

The shade 30 converges the light from the LED light source 20 such that the light emits through the opening thereof with a fixed direction angle, and can have an inside mirror surface.

In this instance, the LED light source 20 and the shade can be mounted with a space d therebetween.

As described before, the lighting fixture can be used as an illumination lamp for lighting by putting a plurality of the LEDs together, especially, as a downlight buried in a ceiling or wall of a building to have an opening side of a shade thereof exposed to an outside of the ceiling or the wall.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conduction type semiconductor layer;
an active layer formed on the first conduction type semiconductor layer; and
a second conduction type semiconductor layer formed on the active layer,
wherein the active layer includes a plurality of quantum well layers and a plurality of quantum barrier layers, a face direction lattice constant of the first conduction type semiconductor layer or the second conduction type semiconductor layer is greater than each of face direction lattice constants of the quantum barrier layers, and the face direction lattice constant of the first conduction type semiconductor layer or the second conduction type semiconductor layer is smaller than each of the face direction lattice constants of the quantum well layers, and
wherein each of the face direction lattice constants of the quantum well layers becomes greater gradually in a thickness direction from an edge to a middle of the respective quantum well layer.

2. The light emitting device as claimed in claim 1, wherein each of the face direction lattice constants of the quantum barrier layers is 3.15 Å to 3.19 Å, each of the face direction lattice constants of the quantum well layers is 3.35 Å to 3.55 Å, and the face direction lattice constant of the first or second conduction type semiconductor layer is about 3.2 Å to 3.34 Å.

3. The light emitting device as claimed in claim 1, wherein each of the quantum well layers and the quantum barrier layers includes indium In.

4. The light emitting device as claimed in claim 1, wherein each of the quantum barrier layers has an energy band gap greater than an energy band gap of each of the quantum well layers, and the first conduction type semiconductor layer has an energy band gap greater than the energy band gap of each of the quantum barrier layers.

5. The light emitting device as claimed in claim 1, wherein one of the quantum barrier layers has a thickness of 5 nm~15 nm, one of the quantum well layers has a thickness of 2 nm~3 nm, and the first conduction type semiconductor layer or the second conduction type semiconductor layer has a thickness of 30 nm~200 um.

6. The light emitting device as claimed in claim 1, wherein the quantum well layers and the quantum barrier layers are alternatively stacked to form a multi-quantum well structure.

7. A light emitting device package comprising:
a package body;
the light emitting device as claimed in claim 1 mounted to the package body;
a first electrode and a second electrode mounted to the package body so as to be respectively connected to the light emitting device; and
a filling material for surrounding the active layer.

8. The light emitting device as claimed in claim 1, wherein each of the face direction lattice constants of the quantum barrier layers is 3.15 Å to 3.25 Å, each of the face direction lattice constants of the quantum well layers is 3.51 Å to 3.55 Å, and the face direction lattice constant of the first or second conduction type semiconductor layer is about 3.26 Å to 3.5 Å.

9. The light emitting device as claimed in claim 3, wherein the quantum well layers have indium contents that gradually vary in the thickness direction.

10. The light emitting device as claimed in claim 9, wherein the quantum barrier layers have indium contents that are same with each other.

11. The light emitting device as claimed in claim 1, wherein the quantum well layers have indium contents gradually varied in the thickness direction.

* * * * *